(12) United States Patent
Giboney et al.

(10) Patent No.: US 6,351,027 B1
(45) Date of Patent: Feb. 26, 2002

(54) CHIP-MOUNTED ENCLOSURE

(75) Inventors: Kirk S. Giboney, Mountain View; Jonathan Simon, San Leandro, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/515,931

(22) Filed: Feb. 29, 2000

(51) Int. Cl.$^7$ .............................................. H01L 27/142
(52) U.S. Cl. ........................ 257/684; 257/432; 257/434; 257/680; 257/777; 438/25; 438/26; 438/27; 438/64; 438/65; 438/66; 438/68; 438/33; 361/820
(58) Field of Search ................................ 257/432–434, 257/680, 684, 777; 438/25–28, 106, 107, 110, 113, 116, 33, 64–66, 68; 361/760, 783, 820

(56) References Cited

U.S. PATENT DOCUMENTS

| | | | | |
|---|---|---|---|---|
| 3,861,783 A | * | 1/1975 | Dill et al. ..................... | 349/156 |
| 3,863,332 A | * | 2/1975 | Leupp et al. .................. | 438/27 |
| 4,122,479 A | * | 10/1978 | Sugawara et al. ........... | 257/777 |
| 4,926,227 A | * | 5/1990 | Jensen ......................... | 257/434 |
| 5,352,852 A | * | 10/1994 | Chun ........................... | 257/680 |
| 5,534,725 A | * | 7/1996 | Hur ............................. | 257/434 |
| 5,591,959 A | * | 1/1997 | Cigna et al. ................. | 257/777 |
| 5,923,958 A | * | 7/1999 | Chou ........................... | 438/116 |
| 6,144,507 A | * | 11/2000 | Hashimoto ................... | 257/680 |
| 6,235,141 B1 | | 5/2001 | Feldman et al. ............. | 156/250 |
| 6,295,156 B1 | | 9/2001 | Feldman et al. ............. | 359/280 |

FOREIGN PATENT DOCUMENTS

| | | | | |
|---|---|---|---|---|
| EP | 0 807 976 A2 | 11/1997 | ........... | H01L/25/18 |
| JP | 58-128762 | 8/1983 | ........... | H01L/27/14 |
| JP | 61-147554 | 7/1986 | ........... | H01L/23/28 |
| WO | WO 99/18612 | 4/1999 | ........... | H01L/27/00 |

OTHER PUBLICATIONS

Stephen H. Hall et al; "VCSEL Electrical Packaging Analysis and Design Guidelines for Multi–GHz Applications"; IEEE Transactions on Components, Packaging, and Manufacturing Technology—Part B, vol. 20, No. 3, pp. 191–201; Aug. 1997.

* cited by examiner

Primary Examiner—Jayprakash N. Gandhi
Assistant Examiner—John B. Vigushin

(57) ABSTRACT

A chip mounted enclosure ("CME") comprises a base formed by an integrated circuit chip, a transducer element disposed on the integrated circuit chip, a side piece surrounding the transducer element that is coupled to the base, and a top piece coupled to the side piece. A method of making a CME comprises mounting a transducer element to a planar surface of an integrated circuit chip, where the planar surface forms a base of the CME. A side piece is fabricated to surround the transducer element. A top piece of the CME is placed on the side piece. Individual CMEs can be fabricated from a wafer assembly, where transducer elements, each respectively mounted to an integrated circuit wafer having corresponding integrated circuit chips, are individually surrounded by a side piece structure that is bonded to the integrated circuit wafer. Individual CMEs are formed by singulating the wafer assembly.

27 Claims, 4 Drawing Sheets

CHIP-MOUNTED ENCLOSURE

This invention was funded by DARPA, Contract # MDA972-97-3-0008. The U.S. Government may have certain rights in this invention.

BACKGROUND OF THE INVENTION

1. Field of the Invention

The present invention is directed to a chip mounted enclosure ("CME") for a transducer element on an integrated circuit chip or wafer.

2. Description of the Related Art

Many transducer elements used in conjunction with integrated circuits require isolation from environmental conditions or controlled interaction with the environment. For example, transducer elements that include opto-electronic components, such as light-emitting diodes, semiconductor lasers, and photodetectors, can degrade in high humidity and often require hermetically sealed enclosures. In addition, opto-electronic components usually require precision alignment with optical elements. Some electrical transducers for position, vibration, pressure, temperature, chemicals, radiation, etc. require controlled access to the environment and may have precision alignment requirements as well.

Conventional enclosures use discrete packages for housing the transducer elements. The package provides for electrical interconnection, mechanical protection and alignment, and controlled interaction with the environment. The transducer element is packaged individually. Alignment is usually accomplished at this or the next level of assembly. The integrated circuit to which the transducer element is electrically connected is mounted separately, usually in another package.

This discrete packaging approach has significant disadvantages. The discrete packages are usually large relative to the transducer size, and assembly methods require handling of individual transducer elements and packages. Moreover, the performance of some transducer elements, such as sensors, is limited by the mass in the package volume. The physical separation necessitated by discrete packaging results in a larger overall assembly. The package cost scales with its size, as do the system costs because of the density penalties. The inherent distance between the transducer element and the integrated circuit degrades high-speed and sensitivity performance of the system. Additionally, the references for mechanical alignment are usually remote, which reduces the precision of alignment.

An example of a conventional form of packaging is that used in optical communications. An opto-electronic component is often mounted in a "TO-can" with a transparent window. The hermetic TO package consists of a round metal base, a cylindrical metal sidewall that is welded or crimped to the base, and a round, usually glass, window. The opto-electronic component is mounted on the base so that light passes to or from it through the window. The opto-electronic component is wirebonded to electrical leads that extend through glass seals in the base.

The assembled TO-can is generally mounted by its leads to a printed circuit board (PCB) which provides electrical interconnection to the separately packaged integrated circuit. The electrical signals must traverse the wirebonds and TO-can leads, PCB vias and traces, and the IC package leads and wirebonds. The parasitic electrical elements associated with this path limit the operating frequency range and contribute to electromagnetic emissions. Using present-day manufacturing processes and designs, this system will support maximum frequencies of operation of 1–2 GHz, such as seen in S. H. Hall, et al., "VCSEL Electrical Packaging Analysis and Design Guidelines for Multi-GHz Applications," IEEE Trans. Comp., Packag., Manufct. Technol. B, vol. 20, no. 3, pp. 191–201, Aug., 1997.

TO-packages are manufactured with relatively large mechanical tolerances in comparison to those required in optical systems. Also, once an opto-electronic device is mounted and sealed in a TO-package, there is no access to mechanical features on the device. The external optics are individually aligned in a separate operation generally using visual reference or active feedback. These methods take longer and require more expensive equipment than some passive alignment techniques utilizing mechanical interaction.

Thus, what is needed is an enclosure for a transducer element and a method of making the same that minimizes the aforementioned problems of conventional packaging approaches.

SUMMARY OF THE INVENTION

According to one embodiment of the present invention, a chip mounted enclosure ("CME") comprises a base formed by an integrated circuit chip, a transducer element disposed on the base, a side piece surrounding the transducer element that is coupled to the base, and a top piece coupled to the side piece.

According to another embodiment of the present invention, a method of making a chip mounted enclosure comprises mounting a transducer element to a planar surface of an integrated circuit chip. A side piece, coupled to the planar surface, is fabricated to surround the transducer element. A top piece of the CME is placed on the side piece.

According to a preferred embodiment, individual CMEs can be fabricated from a wafer assembly. Transducer elements are each mounted to an integrated circuit wafer that comprises corresponding IC chips. A side piece structure comprising corresponding side pieces is bonded to the IC wafer such that the transducer elements are individually surrounded by side pieces. A top piece is bonded to the side piece structure such that the transducer elements are individually fully enclosed. Individual CMEs are formed by singulating the wafer assembly.

With the apparatus and methods according to several of the embodiments of the present invention, distinct advantages over conventional devices can be achieved. For example, a CME can be constructed of small size in a wafer scale assembly that reduces materials consumption and manufacturing costs. Multiple CMEs can be manufactured in a straightforward and cost effective manner. The CME can have a small volume and mass to minimize mass storage and inertia effects. The small size of the CME can also minimize electrical parasitics that limit system performance. In addition, the CME can provide a hermetically sealed cavity for a transducer element. Alternatively, a CME can permit controlled access to the environment, e.g., for metering purposes.

Further features of the invention form the subject matter of the claims and will be explained in more detail, in conjunction with further advantages of the invention, with reference to exemplary embodiments.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the pertinent art to make and use the invention. The drawings, however, do not limit the scope or practice of the invention.

DETAILED DESCRIPTION OF THE PREFERRED EMBODIMENTS

The present invention relates to a chip-mounted enclosure ("CME") for a transducer element. A CME according to a preferred embodiment of the present invention can simultaneously solve several problems associated with conventional enclosures, such as those that affect performance, reliability, density, and manufacturing processes for transducer elements that work with integrated circuits. In addition, an embodiment of the present invention also addresses the problem of exposure to the environment that can affect the performance or reliability of many transducer elements used with integrated circuits.

Figure 1:
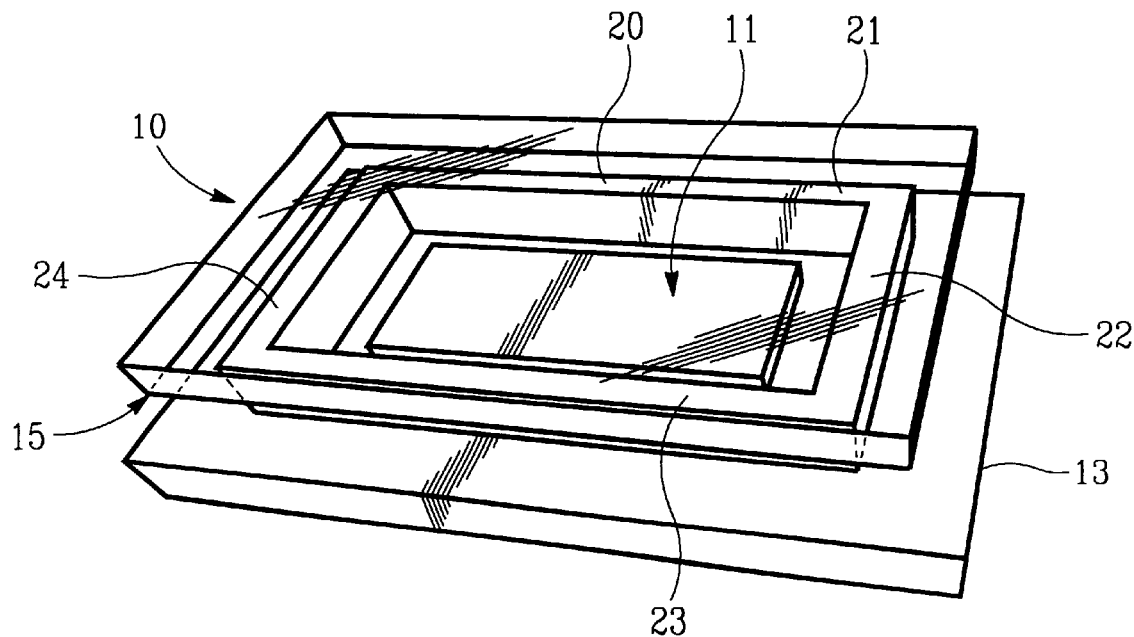
FIG. 1 shows a perspective view of a chip mounted enclosure ("CME") according to an embodiment of the present invention.

FIG. 1 illustrates one CME embodiment assuming an opto-electronic application that includes a transparent top. As will be apparent to one of skill in the art given the present description, CMEs for other applications can share a similar construction. As shown in FIG. 1, a transducer element 11 is encased by a CME 10. The transducer element 11 can be electronic, optoelectronic, electro-mechanical, thermo-electric, electro-chemical, electro-acoustic, or any combination thereof. Further, the transducer element 11 can also be an integral part of an integrated circuit chip rather than a separate component. For example, in an opto-electronic application, the transducer element 11 can be a light-emitting device, such as a light-emitting diode or laser diode, or a light-detecting device such as a photodiode. According to another embodiment of the present invention, CME 10 can include multiple transducer elements within the same enclosure.

CME 10 further includes a base or bottom piece 13. In this example embodiment, bottom piece 13 comprises an integrated circuit chip. The integrated circuit ("IC") chip can be made of any semiconductor material, such as silicon substrates, from which electronic or opto-electronic devices can be fabricated. The IC chip may or may not also include wiring, transistors and/or other circuitry.

According to other embodiments of the present invention, the transducer element can be mounted to a passive IC chip, an active IC chip, or a combination thereof. For example, when the transducer element is mounted to a passive IC chip, electrical connections can be provided from the transducer through wiring in the IC chip to an external terminal or terminals. Thus, the CME of this embodiment of the present invention can be constructed using conventional integrated circuit techniques such that the transducer element can be controlled via externally accessible terminals on a completed package. Alternatively, the transducer element can be mounted to an active IC chip that provides an electrical interaction with the transducer element. For example, the integrated circuit chip can drive the transducer element, process the signals emanating from the transducer element, and/or amplify the signals to and from the transducer element.

CME 10 further includes a side piece 20 that surrounds transducer element 11 and a top piece 15 that completes the CME. In the example embodiment shown in FIG. 1, side piece 20 comprises sides 21,22,23,24 that surround the transducer element 11 and are coupled to CME bottom piece 13 and top piece 15. In a preferred embodiment, the side piece of the CME is bonded to the top and/or bottom pieces. The bonding technique used to bond the CME side piece to the top and/or bottom pieces can include, but is not limited to, metal-to-metal bonding, eutectic bonding, and ultrasonic bonding. The exact shape of the side piece is not critical. For example, the side piece can form a rectangular, circular, or elliptical enclosure about the transducer element. In addition, the side piece and the top piece can be constructed as a single unit, e.g., as a dome-like or hemispherical enclosure. The side piece can be constructed and/or bonded onto the CME bottom piece 13 and/or CME top piece 15 by various techniques, including micro-machining, lithography, stamping, and electroplating, as will be explained in further detail below. To facilitate straightforward bonding, in a preferred embodiment, side piece 20 includes top and bottom surface portions that respectively match the contours of CME top piece 15 and CME bottom piece 13.

The CME side and top pieces can be constructed of any solid material including plastics. However, if a hermetic enclosure is desired, this type of enclosure may require the use of certain metals, inorganic semiconductors, inorganic insulators, ceramics, or glasses. The top and side pieces may be one piece or multiple pieces. Alternatively, in some applications, CME top piece 15 comprises a second integrated circuit chip, with or without its own transducer element.

One advantage of the present invention is that the bottom, side, and top pieces of the CME can be produced and assembled in wafer scale. These structures may be formed by parts that serve mechanical, optical, or electrical functions in addition to composing the enclosure.

For example, in an opto-electronic application, sides 21–24 and/or top piece 15 may be substantially transparent (i.e., allowing passage of a substantial portion of a desired wavelength of electromagnetic radiation) and may also incorporate an optical element or elements, such as mirrors, refractive lenses, diffractive lenses, or the like. For purposes of the present invention, the term optical element refers to any element that modifies the pattern or composition of light passing through it. This would include elements whose purpose is to modify the amplitude, phase, direction, or frequency spectrum of the light. These functions could be accomplished with absorptive, refractive, diffractive, reflective, or nonlinear optical elements.

The dimensions and shapes of the sides determine the appropriate free-space optical path lengths for the optical system composed of the transducer element and optical element(s) utilized. For surface-normal opto-electronic transducer elements, the CME sides are designed to set the correct height (i.e., distance above the transducer element) of a lens or lenses incorporated in a transparent CME top.

Figure 2A:
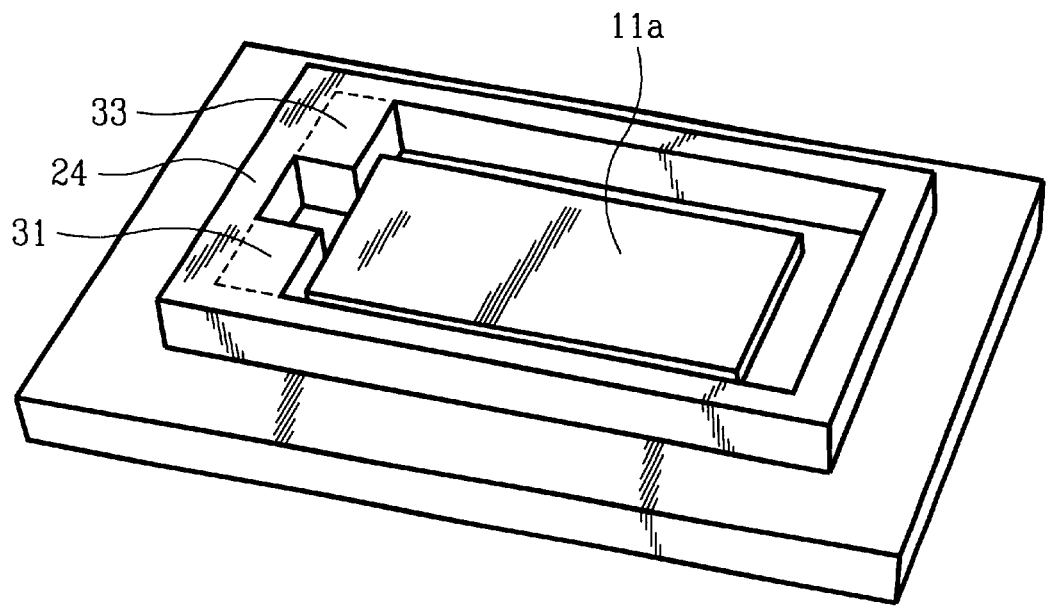
FIG. 2A shows an example CME having an edge-coupled transducer element.

In another example, edge-coupled opto-electronic transducer elements and fiducials can be designed into the CME side piece to set the proper optical path distance. An example is illustrated in the embodiment shown in FIG. 2A, in which one or more sides of the CME side piece are transparent. In this example, side 24 is transparent. The transparent CME side 24 for an edge-coupled transducer element 11a can also include mechanical stops 31 and 33, which can be used for alignment of the side piece and the transducer relative to one another.

Figure 2B:
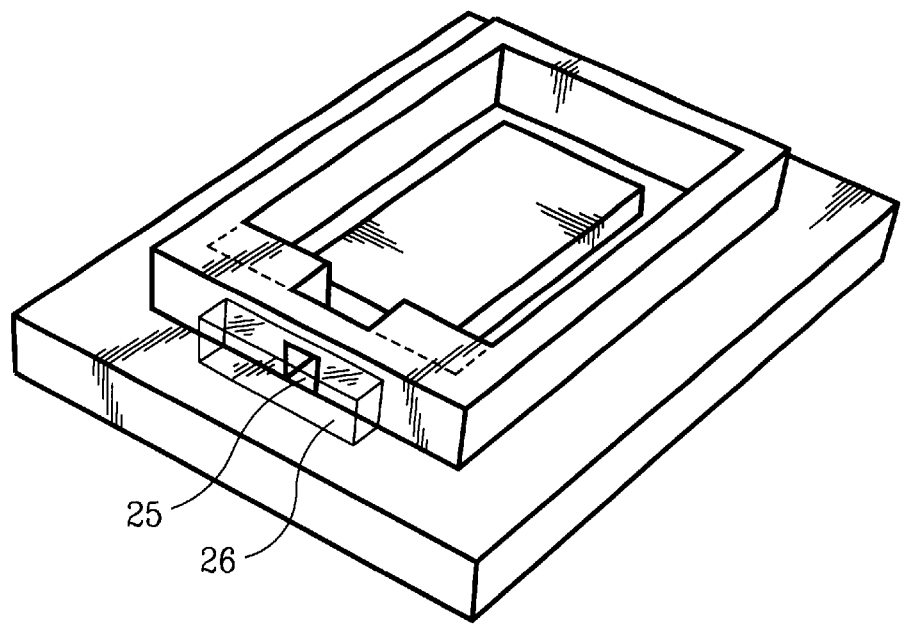
FIG. 2B shows an example CME having an edge-coupled transducer element and a lens element coupled to a side piece of the CME.

Alternatively, as shown in FIG. 2B, one or more sides of the CME side piece can be opaque. In this example, a hole 25 is covered by a separate transparent optical element 26, such as a window, lens, filter, grating, or the like.

In another embodiment of the present invention, the CME side and/or top pieces can also include an electrically conducting material. Example conducting materials include, but are not limited to, metals, semimetals, and semiconductors. Composites, for example a graphite containing matrix, can also be utilized. These materials can be applied as films or incorporated throughout the volume of the sides or top pieces. For example, these electrically conducting materials can be useful in controlling heat dissipation and/or electromagnetic emissions, either those emissions that reach the transducer element from the environment or those emissions that reach the environment from the transducer.

In a non-hermetic embodiment, it is also desirable to provide metered interaction between transducer elements and the environment as part of a device operation. By "metered interaction" it is meant controlling the mass or energy passing through the CME to or from the transducer element. For example, an optical element in the top or side pieces can control the light entering or exiting the CME. Another example includes an orifice that controls the amount of gas or liquid reaching a chemical sensor. The CME of an embodiment of the present invention allows for controlling the environmental contact with transducer elements in a minimum size cavity that can be hermetic when constructed from appropriate materials.

CMEs mounted to IC chips to encase transducer elements can be very small in size. For example, CME 10 shown FIG. 1 can have a volume of about 1 $mm^3$ to about 3 $mm^3$. The small size of the CMEs of the present invention offers several advantages. The minimum size reduces the material required and the associated costs. The small volume of the cavity reduces the mass effects. For example, the measurement speed and accuracy of a sensor may be limited by mass attenuation, storage, and inertia effects.

In another example embodiment, if the transducer being enclosed is a temperature sensing device, such as a thermometer, the transducer has a certain heat capacity, requiring a certain amount of energy to raise its temperature. A thermometer thus tends to cool its environment when it is cooler than the environment, and warm the surrounding environment when it is warmer. The time required for the thermometer to come to steady state with its environment is also determined by its heat capacity or thermal mass. Pressure, chemical, or radiation sensors, etc. will also have mass-associated limitations. Thus, the small internal volume and mass of the CME of the present invention helps to better control various environmental effects of the transducer element.

The small size of the CME also minimizes electrical parasitics that can limit the system performance. The electrical parasitics affect the speed with which electrical signals can be communicated between the transducer elements and the integrated circuit. The electrical parasitics can also facilitate electromagnetic emissions that effect other components in the system. Conversely, the electrical parasitics can act to enhance electromagnetic interference signals present in the vicinity of the device. Strategic use of conductive materials in the construction of the CME can also reduce electromagnetic emissions and susceptibility to interference.

According to an embodiment of the present invention, the CME can be manufactured and assembled with high precision. The small size and utilization of stable materials, such as many metals, semiconductors, glasses, and ceramics allows sub-micron alignment tolerances over large ranges of environmental conditions such as temperature and humidity. This allows for precision alignment of the transducer element, the IC chip, and a CME component such as a lens or aperture.

The CME components, such as the top and side pieces, can be fabricated in large volume to high precision with micro-machining techniques. The components can also be assembled in wafer form using standard photolithographic, deposition, or plating techniques so that thousands of parts can be aligned and bonded simultaneously. This speeds manufacturing and reduces equipment and labor costs.

The CME of the present invention has significant advantages over discrete packaging approaches in several areas. For example, the CME internal volume and mass can be lower than that of many discretely packaged solutions. Electrical parasitics between the transducer element in a CME and the integrated circuit will be lower than those for discretely packaged systems.

Further, the CME components, the transducer element, and the integrated circuit can all be aligned to one another with greater precision over a greater range of environmental conditions than is possible with a discretely package assembly. CMEs can be fabricated and assembled in the thousands simultaneously, while discrete packages are assembled singly. Thus, manufacturing costs can be saved because a single wafer alignment can be utilized to simultaneously align thousands of individual CMEs during a wafer scale assembly.

According to another embodiment of the present invention, multiple CMEs can be produced in "wafer scale" on an integrated circuit ("IC") wafer. For purposes of the present invention, an IC wafer can be a conventional wafer used in semiconductor applications, such as a silicon wafer, which may or may not include various circuitry, wiring and components. Also, an IC wafer may or may not include a plurality of IC chips.

A straightforward process can be utilized to construct and manufacture multiple CMEs. The CME components may each be fabricated in wafer form. Preferably, the transducer elements are singulated prior to assembly, although they may also be assembled in wafer form. Many CMEs are simultaneously assembled in an array on an IC wafer, which is ultimately singulated into individual assemblies or chips having CMEs. This process is illustrated for a surface-normal opto-electronic transducer element in FIGS. 3A–E.

Figure 3A:
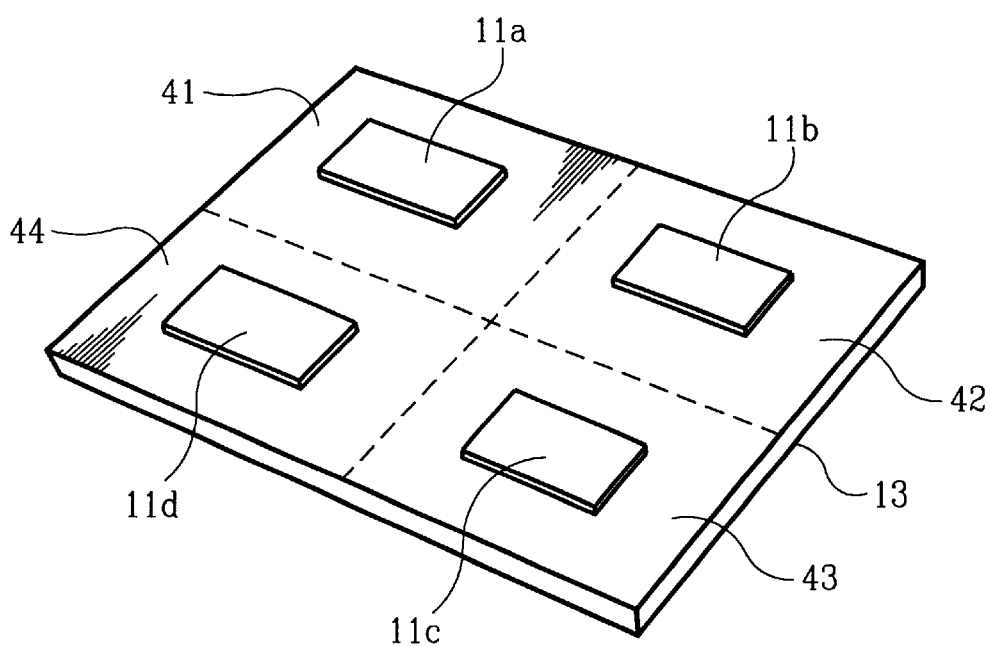
FIGS. 3A–3E illustrate a process for forming chip mounted enclosure assemblies according to an embodiment of the present invention.
Figure 3B:
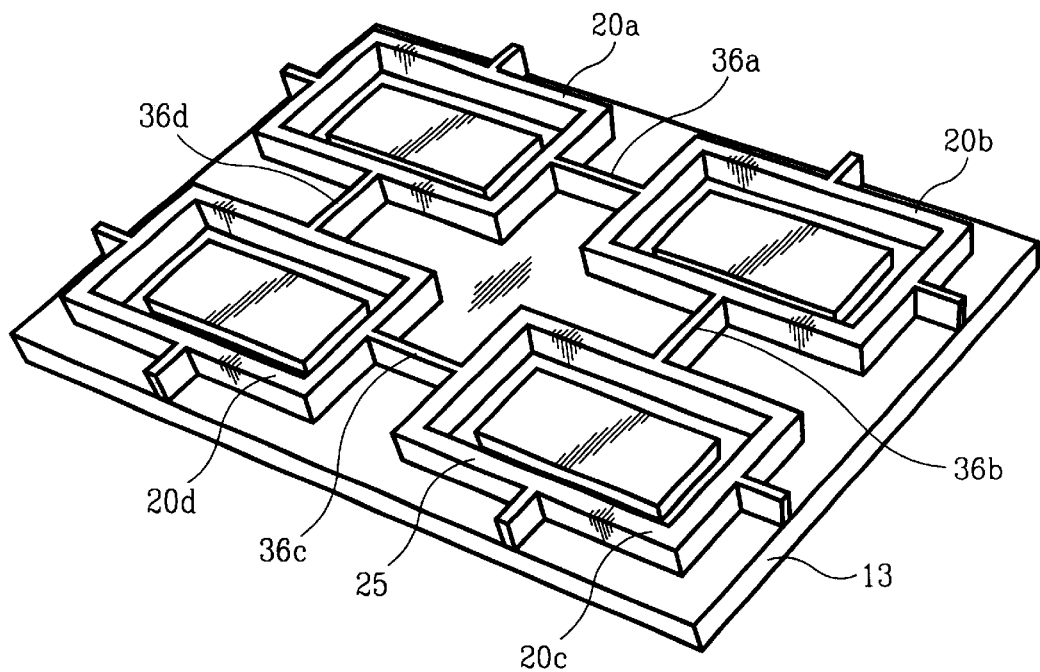

FIG. 3A shows an array of transducer elements 11a–11d mounted on part of a bottom piece 13 that comprises an integrated circuit wafer. The IC wafer may be fabricated by standard techniques. The wafer surface is preferably smooth and planar to within a specification that depends on the material, construction, and attachment method for the CME sides.

In this embodiment, the integrated circuit wafer includes a plurality of IC chips, such as IC chips 41, 42, 43, and 44 shown in FIG. 3A, corresponding to the number of transducer elements. Each transducer element can be electrically and/or mechanically connected to a respective IC chip.

Metal pads (not shown) can be exposed at each IC chip surface for electrical connection of the transducer element and possibly also for its mechanical attachment. A metal pattern may or may not be required on the IC chip surface for mechanical attachment of the CME sides. Connection may be accomplished with standard epoxy or solder die attach and wirebonds. Alternatively, various "flip-chip" processes can be used. The choice of how the transducer element is mounted to the IC chip is not critical to the invention and will be apparent to one of skill in the art given the present description. Alternatively, more than one transducer element can be mounted to an IC chip.

According to the present invention, the CME side pieces can be pre-fabricated on a wafer scale as a single construction, e.g., as a side piece structure, to provide an enclosure for individual transducer elements of an array of transducer elements. For example, CME side pieces can be mounted onto the IC chip as graphically shown in FIG. 3B. In this embodiment, a CME side piece structure 25 comprises an array of CME side pieces, such as CME side pieces 20a–20d, and links 36a–36d. CME side piece structure 25 can be produced by a stamping, extrusion, casting, forging, molding, machining, micro-machining, chemical etching, ablation, electroplating, or other process appropriate for the materials employed.

For example, one preferred fabrication technique for constructing an array of CME side pieces is silicon micromachining. Links (e.g., 36a–36d) can be formed to connect the CME side pieces in an array so that the CME side pieces for the entire IC wafer or a portion thereof can be simultaneously aligned and attached to the IC wafer. Preferably, portions of the bottom surfaces of the CME side piece structure match the contour of the IC wafer so that the CME side piece structure forms a good seal with the IC wafer. The bonding technique used to bond the CME side piece structure to an IC wafer surface can include, but is not limited to, metal-to-metal bonding, eutectic bonding, heat bonding, chemical bonding, and ultrasonic bonding. These bonding techniques can form a hermetic bond between the various inorganic materials used in the fabrication of the IC wafer and the CME side piece structure. Alternatively, conventional adhesives can be used to bond the CME side piece structure to the IC wafer. However, most adhesives do not provide a hermetic seal.

Figure 3C:
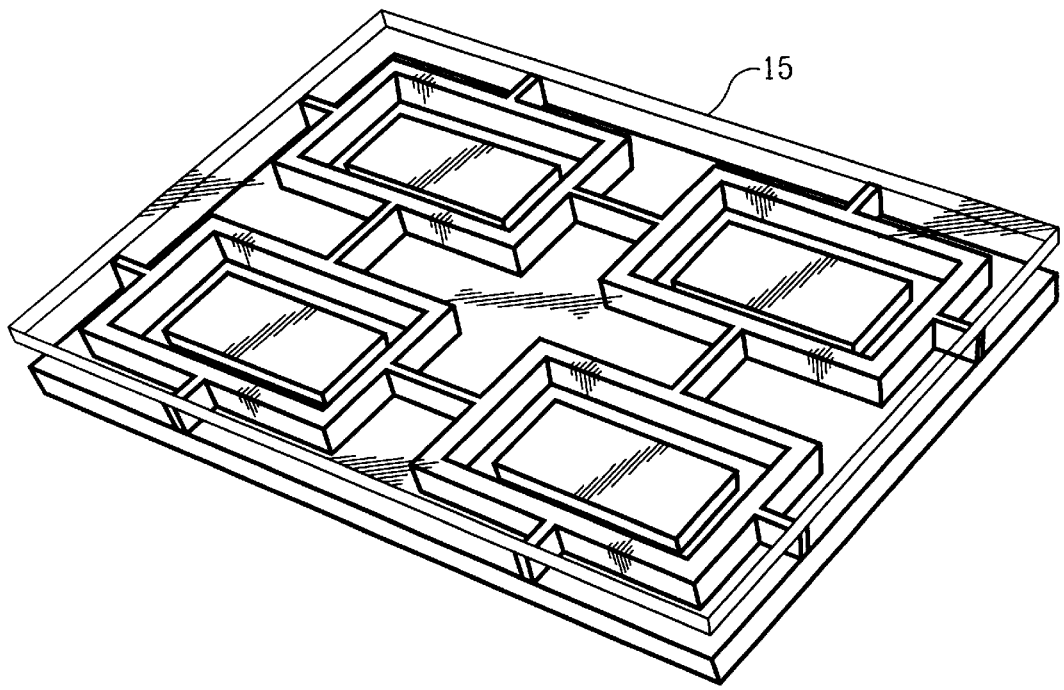

The CME top piece 15 can be fabricated as a single wafer as shown in FIG. 3C. CME top piece 15 can be constructed of any solid material including plastics. However, if a hermetic enclosure is desired, this type of enclosure may require the use of certain metals, inorganic semiconductors, inorganic insulators, ceramics, or glasses. Preferably, the portions of the surfaces of the CME side piece structure that bond to the CME top piece match in surface contour to the CME top piece. In the example of a surface-normal optoelectronic transducer element, the CME top piece is preferably transparent and can further incorporate optical elements and fiducials. In one embodiment, the CME top piece is aligned to the opto-electronic transducer elements and bonded to the CME sides. One preferred bonding technique that can be utilized is anodic bonding.

Alternatively, according to another embodiment of the present invention, the top piece can be mounted or bonded onto the CME side piece structure prior to the CME side piece structure being bonded to the IC wafer surface. For example, the CME side piece structure can be constructed in-situ on the top piece by an electroplating process, i.e., constructed as one piece. In this example, a metal layer/pattern can be formed on the top piece of the CME, by, e.g., a conventional sputtering or evaporation process. This metal pattern can act as a seed layer for a plating process whereby the side pieces comprising the CME side piece structure can be formed. Optionally, an electroplating mask can be constructed by a conventional photolithographic process to define the lateral dimensions of the side pieces. During electroplating, the side pieces are formed on the seed layer. The height of the side piece structure is controlled by the electroplating process in a conventional manner. The resulting overall construction, which comprises the top piece and side piece structure can then be mounted to an IC chip or an IC wafer. Alternatively, other conventional lithographic and deposition processes can be used to form the top piece/side piece structure, as will be apparent to one of skill in the art given the present description.

Figure 3D:
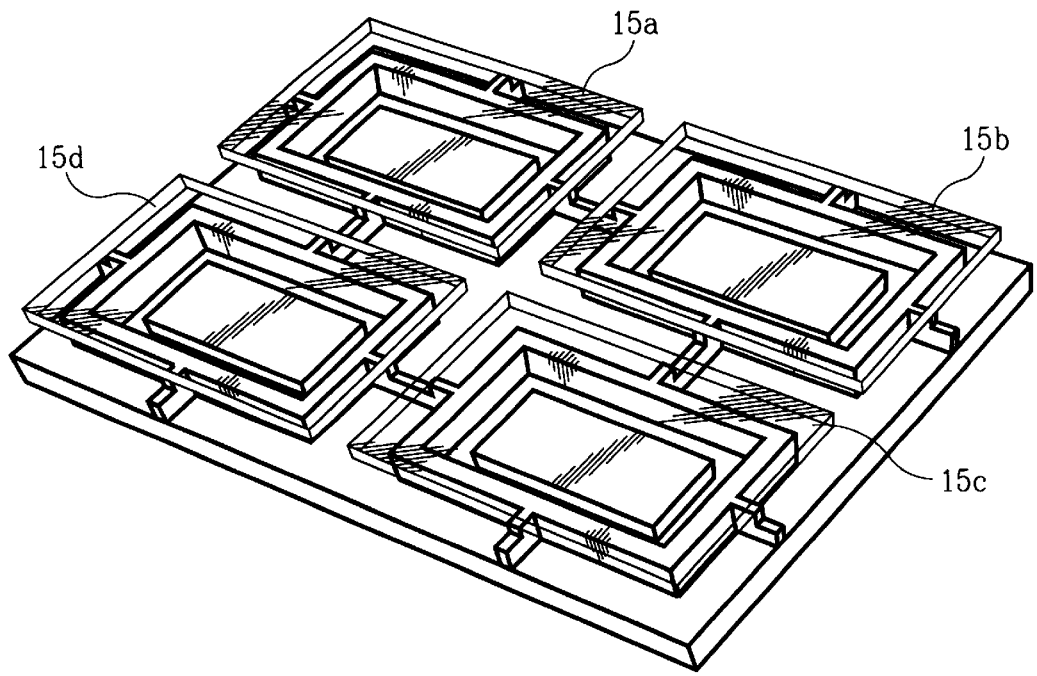
Figure 3E:
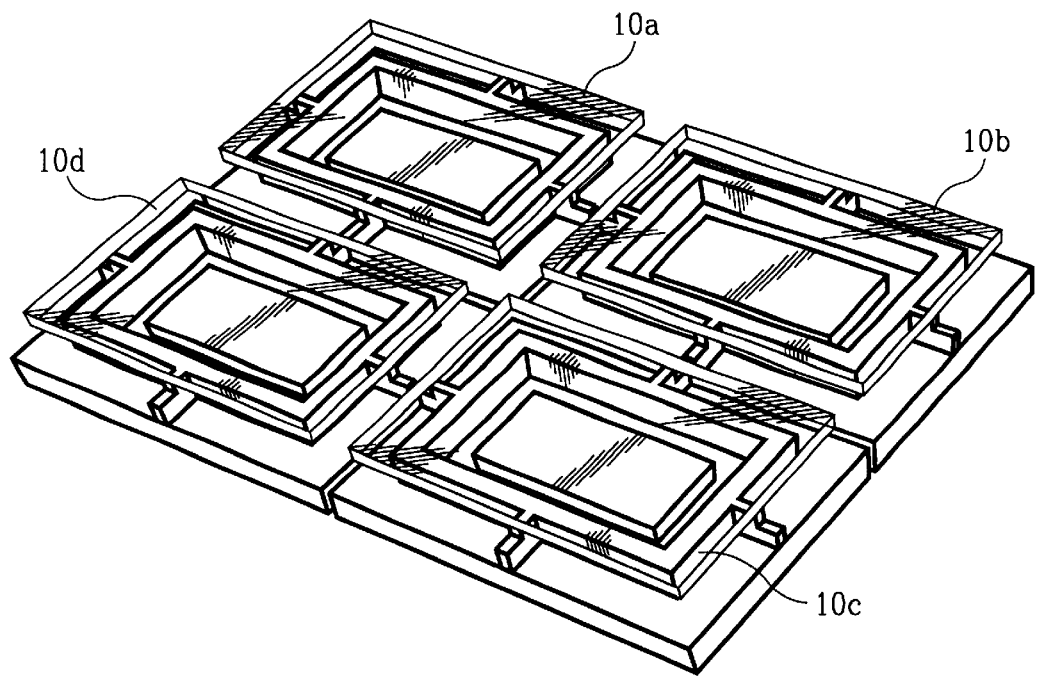

Once the top and side pieces are bonded to the bottom piece, the CME wafer assembly is completed. To produce individual CME assemblies, the CME wafer assembly can be singulated. An example singulation process is shown in FIGS. 3D and 3E. For example, FIGS. 3D and 3E show that the CME wafer assembly can be singulated using two different sawing operations. First, the CME wafer assembly is sawn part-way through with a wide saw blade such that the CME top wafer 15 is singulated, as shown in FIG. 3D. In this example, the singulation produces four separate top pieces 15a–15d. The wide saw blade cuts through the CME top wafer and part way through the CME side links, without cutting the IC wafer. The singulation is completed, as shown in FIG. 3E, by using a narrow blade to cut the IC wafer and the remaining pieces of the CME side links to produce the individual CME assemblies 10a–10d. Using a wide saw blade to cut through the CME top wafer 15 and part-way through the CME side links and using a narrow saw blade to cut through the remainder of the CME side links and the IC wafer removes the portion of the top piece that covers the periphery of the IC chip while retaining the periphery of the IC chip. This exposes the periphery of the IC chip and provides access for wirebond or other electrical connections to be made to the periphery of the IC chip. Alternatively, other methods of singulating the wafer assembly into individual CMEs can be utilized, as would be apparent to one of skill in the art given the present description.

In operation, the completed CME assembly is then assembled into a larger system. Standard processes, such as epoxy die attach and wirebond, can provide mechanical, thermal, and electrical interconnection. The next level packaging completes the external coupling of the transducer element.

For example, in a fiber-optic application, the complete CME assembly containing a semiconductor laser or photodetector element can be mounted in a package that provides mechanical, thermal, and electrical connections. In addition, the package can contain a receptacle that aligns a fiber-optic connector to the optical path. Light couples between the fiber and the photodetector(s) or laser(s) through a transparent CME top or side piece(s) that can also incorporate optical elements. For example, an optical fiber (not shown) can be coupled to optical element 26 of FIG. 2B to collect and direct optical output to a desired location.

In summary, the CME of the present invention simultaneously provides several desirable characteristics. For example, the CME can provide a hermetically sealed cavity for a transducer element. Shielding of electromagnetic fields can also be provided by using conductive materials. Alternatively, the CME can permit controlled access to the environment, e.g. for metering purposes. The physical dimensions of the CME can be of minimum size to minimize materials consumption and to allow high-density assemblies. The CME can also have minimum volume and mass to minimize mass storage and inertia effects. Further, the CME minimizes electrical parasitic elements so that electrical speed is maximized and electromagnetic emissions are minimized. The CME can hold sub-micron alignment tolerances and utilize high-precision mechanical alignment processes during assembly. Moreover, CME components can be fabricated and assembled in wafer scale, leveraging mass production to further reduce manufacturing costs.

While the invention has been described in detail and with reference to specific embodiments thereof, it will be apparent to one skilled in the art that various changes and modifications can be made therein without departing from the scope of the invention. Thus, the breadth and scope of the present invention should not be limited by any of the above-described exemplary embodiments.

What is claimed is:

1. A chip mounted enclosure, comprising:
    a base formed by an integrated circuit chip;
    a separate transducer element mounted on a surface of said base;
    a side piece surrounding said transducer element and coupled to said base; and
    a top piece coupled to said side piece.

2. The chip mounted enclosure according to claim 1, wherein said transducer element is selected from the group consisting of electronic, optoelectronic, electro-mechanical, thermo-electric, electro-chemical, electro-acoustic devices.

3. The chip mounted enclosure according to claim 1, wherein said side piece is bonded to said base.

4. The chip mounted enclosure according to claim 1, wherein the chip mounted enclosure is a hermetic enclosure and said side and top pieces are formed from materials selected from the group consisting of glass, inorganic semiconductors, inorganic insulators, metals, and ceramics.

5. The chip mounted enclosure according to claim 1, wherein said top piece comprises a substantially transparent material.

6. The chip mounted enclosure according to claim 1, wherein said side piece is bonded to said top piece.

7. The chip mounted enclosure according to claim 1, wherein said top piece comprises an electrically conducting material.

8. The chip mounted enclosure according to claim 1, wherein a portion of said side piece includes an electrically conducting material.

9. The chip mounted enclosure according to claim 1, further comprising stops for alignment of said transducer.

10. The chip mounted enclosure according to claim 1, wherein said base comprises a substantially transparent material.

11. The chip mounted enclosure according to claim 1, wherein said base includes an optical element.

12. A chip mounted enclosure, comprising:
    a base formed by an integrated circuit chip;
    a transducer element disposed on said base;
    a side piece surrounding said transducer element and coupled to said base; and
    a top piece coupled to said side piece, wherein said integrated circuit chip is a first integrated circuit chip and said top piece comprises a second integrated circuit chip.

13. A chip mounted enclosure, comprising:
    a base formed by an integrated circuit chip;
    a transducer element disposed on said base;
    a side piece surrounding said transducer element and coupled to said base; and
    a top piece coupled to said side, wherein said transducer element is a first transducer element and wherein said top piece comprises a second transducer element.

14. A chip mounted enclosure, comprising:
    a base formed by an integrated circuit chip;
    a transducer element disposed on said base;
    a side piece surrounding said transducer element and coupled to said base; and
    a top piece coupled to said side piece, wherein a portion of said side piece includes a substantially transparent material.

15. A chip mounted enclosure, comprising:
    a base formed by an integrated circuit chip;
    a transducer element disposed on said base;
    a side piece surrounding said transducer element and coupled to said base; and
    a top piece coupled to said side piece, wherein said top piece comprises an optical element.

16. A chip mounted enclosure, comprising:
    a base formed by an integrated circuit chip;
    a transducer element disposed on said base;
    a side piece surrounding said transducer element and coupled to said base; and
    a top piece coupled to said side piece, wherein said side piece includes an optical element.

17. A method of fabricating a chip mounted enclosure, comprising:
    mounting a separate transducer element to a planar surface of an integrated circuit chip;
    fabricating a side piece to surround said transducer element; and
    providing a top piece placeable on a surface of said side piece.

18. The method according to claim 17, further comprising:
    bonding said side piece to said planar surface.

19. The method according to claim 17, further comprising:
    bonding said top piece to said side piece.

20. The method according to claim 17, wherein the mounting step comprises a process selected from the group consisting of an electrical connection process, a mechanical connection process, and a flip-chip process.

21. A method of fabricating a chip mounted enclosure, comprising:
    mounting transducer elements onto a planar surface of an integrated circuit wafer that comprises corresponding integrated circuit chips; and
    bonding a side piece structure that includes corresponding side pieces to said planar surface of said integrated circuit wafer to individually enclose each of said transducer elements and to form a wafer assembly.

22. The method according to claim 21, wherein said side piece structure further includes links for an alignment of said side piece structure.

23. The method according to claim 21, wherein said side piece structure includes a top piece bonded onto said side piece structure.

24. The method according to claim 23, further comprising:
   singulating said wafer assembly.

25. The method of claim 23, wherein said singulating comprises:
   cutting said top piece of said wafer assembly using a first cutting procedure; and
   cutting said integrated circuit wafer using a second cutting procedure different from said first cutting procedure to produce individual chip-mounted enclosure assemblies, each of said individual chip-mounted enclosure assemblies having a transducer element.

26. A method of fabricating a chip mounted enclosure, comprising:
   disposing transducer elements on an integrated circuit wafer that comprises corresponding integrated circuit chips;
   bonding a side piece structure that includes corresponding side pieces to a planar surface of said integrated circuit wafer to individually enclose each of said transducer elements and to form a wafer assembly; and
   singulating said wafer assembly.

27. The method according to claim 26, wherein the disposing step comprises integrally forming the transducer elements in the integrated circuit wafer.

* * * * *